United States Patent
Aoyagi et al.

(10) Patent No.: US 9,793,443 B2
(45) Date of Patent: Oct. 17, 2017

(54) METHOD FOR MANUFACTURING AN OPTICAL UNIT AND ELECTRONIC APPARATUS

(71) Applicant: Sony Semiconductor Solutions Corporation, Kanagawa (JP)

(72) Inventors: Akiyoshi Aoyagi, Kanagawa (JP); Gyongsok Song, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/290,549

(22) Filed: Oct. 11, 2016

(65) Prior Publication Data

US 2017/0062662 A1   Mar. 2, 2017

Related U.S. Application Data

(62) Division of application No. 14/438,910, filed as application No. PCT/JP2013/078962 on Oct. 25, 2013.

(30) Foreign Application Priority Data

Nov. 5, 2012 (JP) ................ 2012-243318

(51) Int. Cl.
   *H01L 51/52* (2006.01)
   *H01L 33/48* (2010.01)
   (Continued)

(52) U.S. Cl.
   CPC .......... *H01L 33/483* (2013.01); *H01L 25/042* (2013.01); *H01L 25/0753* (2013.01);
   (Continued)

(58) Field of Classification Search
   CPC . H01L 51/52; H01L 51/5259; H01L 51/5253; H01L 33/483
   See application file for complete search history.

(56) References Cited

U.S. PATENT DOCUMENTS

2004/0159920 A1   8/2004   Omori
2005/0005848 A1   1/2005   Yamazaki et al.
(Continued)

FOREIGN PATENT DOCUMENTS

JP   2003-243154 A   8/2003
JP   2004-327272 A   11/2004
(Continued)

*Primary Examiner* — Phuc Dang
(74) *Attorney, Agent, or Firm* — Wolf, Greenfield & Sacks, P.C.

(57) ABSTRACT

A purpose of the present disclosure is to provide an optical unit that is capable of effectively sealing one or a plurality of optical devices even without a special material, a special structure, etc.

In an optical unit of the present disclosure, the sealing section (50) includes: a circular seal section (51) surrounding one or a plurality of optical devices (40) on a wiring substrate from an in-plane direction of the wiring substrate; and an inside filling section (52) with which inside of the seal section (51) is filled and that seals the one or plurality of optical devices (40). The optical devices (40) are each a light emitting unit, a light receiving device, an image sensor, an X-ray sensor, or a power generating device. The seal section (51) and the inside filling section (52) are each configured of a cured thermosetting resin. The inside filling section (52) has light transmittance that is higher than light transmittance of the seal section (51). The inside filling section (52) has a modulus of elasticity that is smaller than a modulus of elasticity of the seal section (51).

6 Claims, 17 Drawing Sheets

(51) Int. Cl.
*H01L 25/075* (2006.01)
*H01L 25/04* (2014.01)
*H01L 31/0203* (2014.01)
*H01L 31/18* (2006.01)
*H01L 33/56* (2010.01)
*H01L 27/32* (2006.01)
*H01L 25/00* (2006.01)
*H01L 33/52* (2010.01)

(52) U.S. Cl.
CPC .............. *H01L 25/50* (2013.01); *H01L 27/32* (2013.01); *H01L 31/0203* (2013.01); *H01L 31/18* (2013.01); *H01L 33/56* (2013.01); *H01L 33/486* (2013.01); *H01L 33/52* (2013.01); *H01L 2924/0002* (2013.01); *H01L 2933/005* (2013.01); *H01L 2933/0033* (2013.01); *Y02P 70/521* (2015.11)

(56) References Cited

U.S. PATENT DOCUMENTS

| | | | |
|---|---|---|---|
| 2005/0029906 A1* | 2/2005 | Miyaji | H03H 3/08 310/348 |
| 2005/0142382 A1 | 6/2005 | Menda et al. | |
| 2006/0001147 A1 | 1/2006 | Tomita et al. | |
| 2007/0278493 A1 | 12/2007 | Sato | |
| 2008/0284331 A1 | 11/2008 | Hayashi | |
| 2009/0256166 A1* | 10/2009 | Koike | H01L 33/501 257/98 |
| 2010/0045177 A1 | 2/2010 | Oh et al. | |
| 2010/0075563 A1* | 3/2010 | Matsui | H01L 51/5246 445/25 |
| 2010/0117525 A1 | 5/2010 | Warashina et al. | |
| 2010/0283721 A1* | 11/2010 | Wang | G02F 1/1343 345/107 |
| 2011/0074037 A1* | 3/2011 | Takeshima | H01L 23/3128 257/773 |
| 2011/0242792 A1* | 10/2011 | Choi | B32B 37/12 362/97.1 |
| 2012/0080219 A1* | 4/2012 | Takeuchi | H01L 21/4846 174/259 |
| 2012/0080671 A1* | 4/2012 | Niboshi | H01L 51/524 257/40 |
| 2012/0319092 A1 | 12/2012 | Shimomura | |
| 2012/0319150 A1* | 12/2012 | Shimomura | H01L 24/97 257/98 |
| 2013/0001610 A1 | 1/2013 | Iwakura et al. | |
| 2013/0141606 A1 | 6/2013 | Shimizu | |
| 2013/0208205 A1 | 8/2013 | Misaki | |
| 2013/0222715 A1 | 8/2013 | Uehara et al. | |
| 2014/0061704 A1 | 3/2014 | Yamada et al. | |
| 2015/0295140 A1 | 10/2015 | Aoyagi et al. | |

FOREIGN PATENT DOCUMENTS

| | | |
|---|---|---|
| JP | 2006-184873 A | 7/2006 |
| JP | 2006-268020 A | 10/2006 |
| JP | 2008-010402 A | 1/2008 |
| JP | 2008-288012 A | 11/2008 |
| JP | 2009-048834 A | 3/2009 |
| JP | 2009-272591 A | 11/2009 |
| JP | 2010-287421 A | 12/2010 |

* cited by examiner

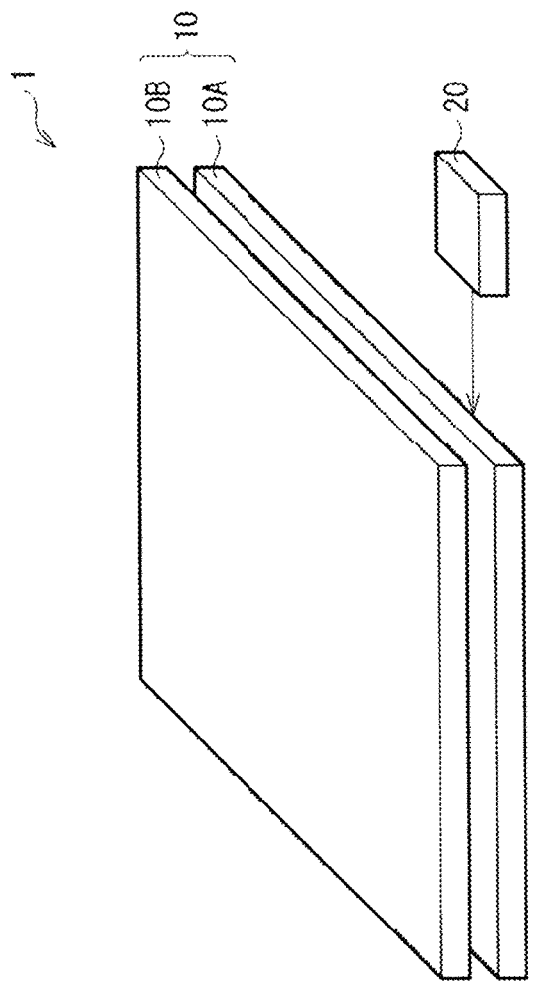
[ FIG. 1 ]

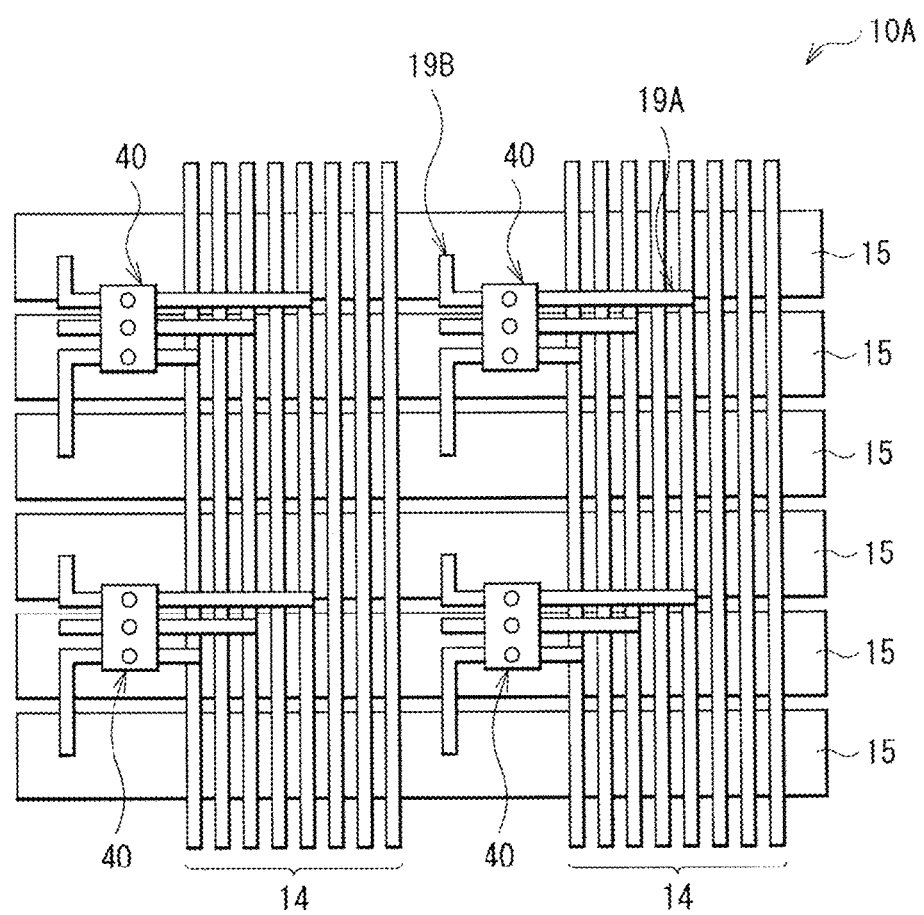
[ FIG. 2 ]

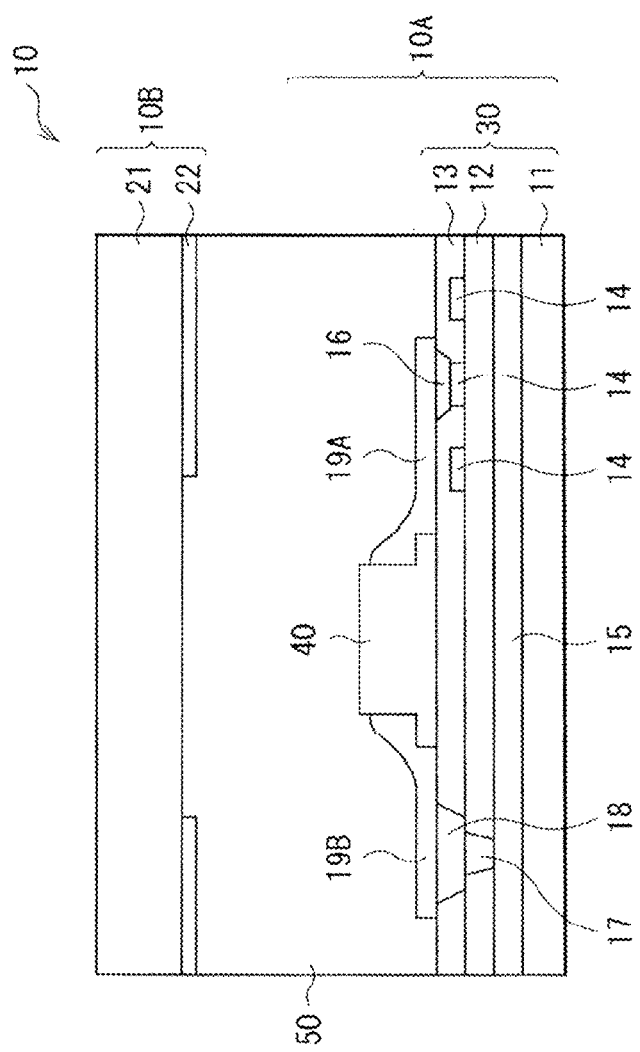
[FIG. 3]

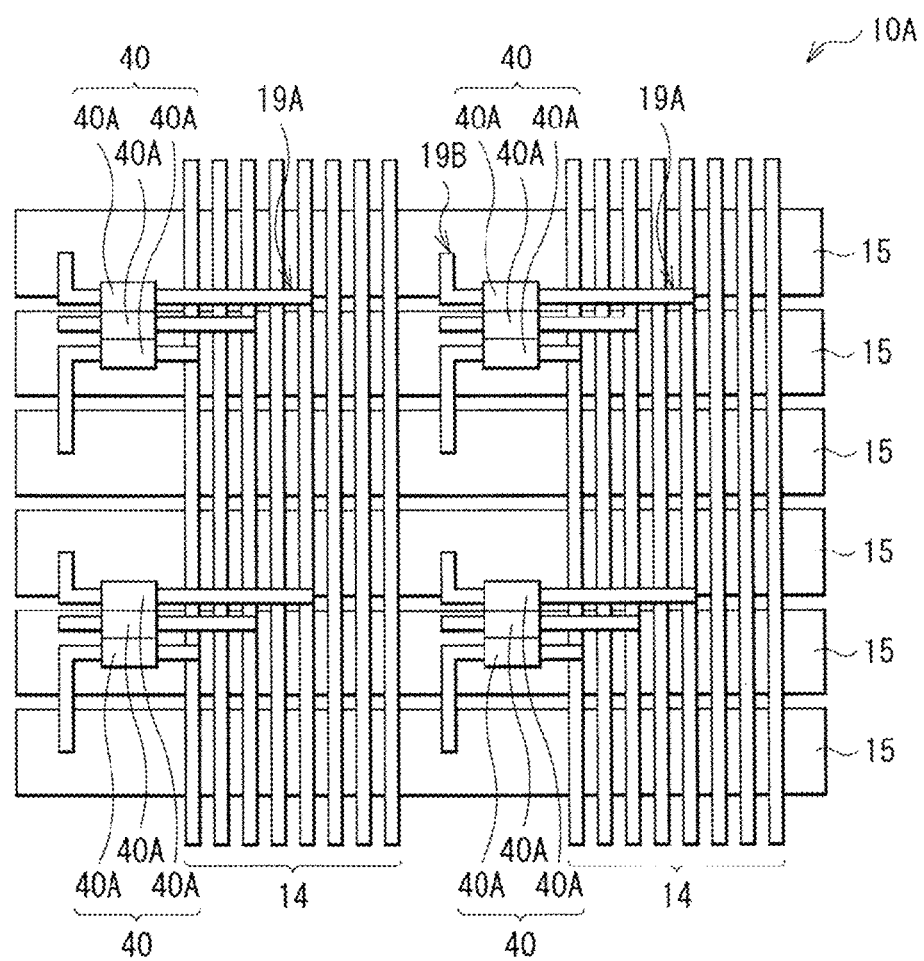
[ FIG. 4 ]

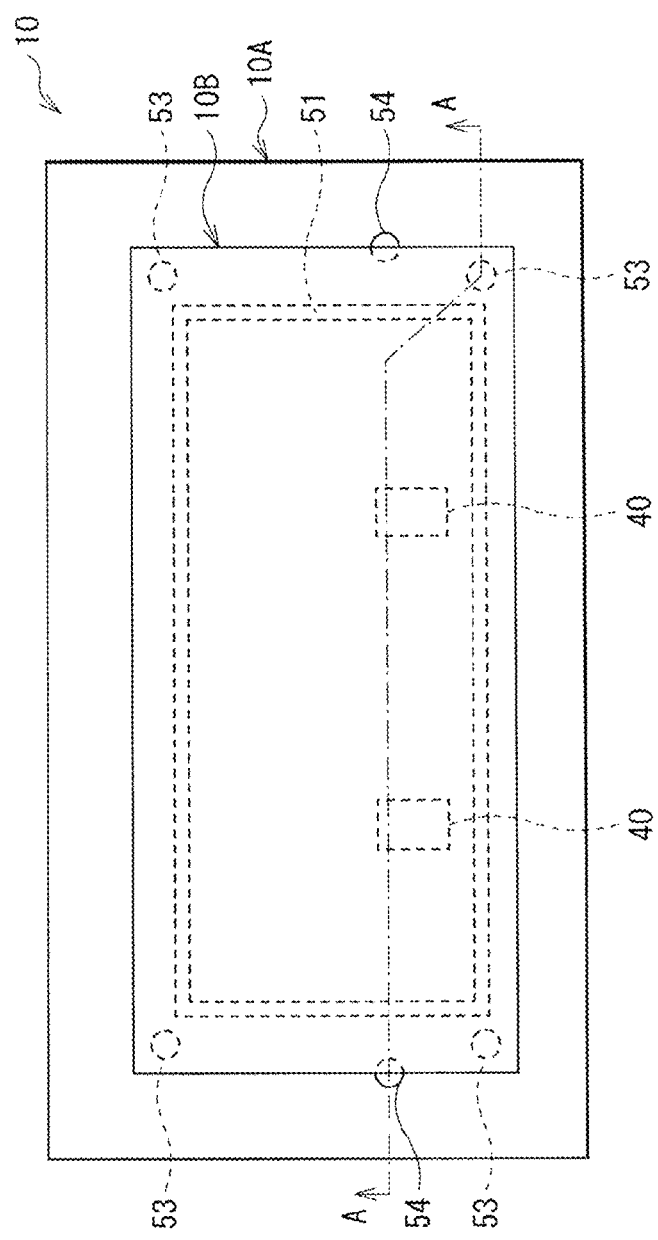

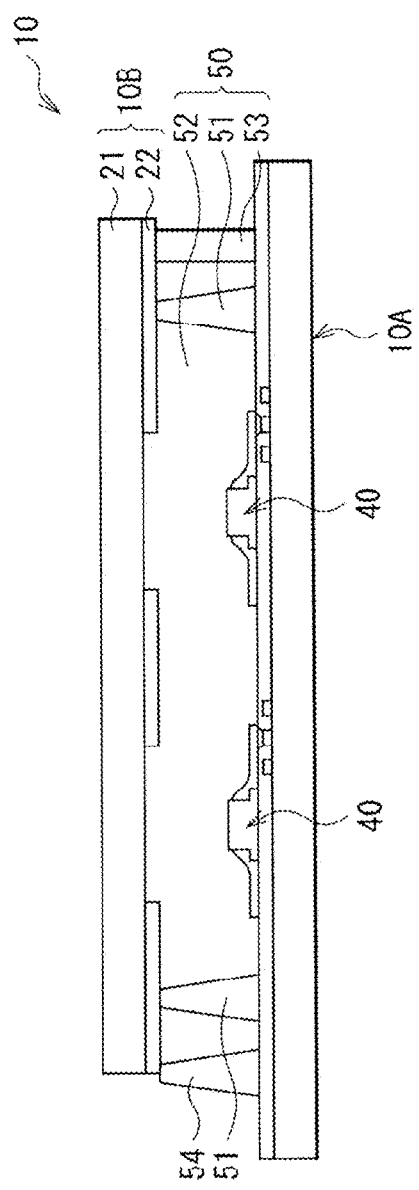
[FIG. 5B]

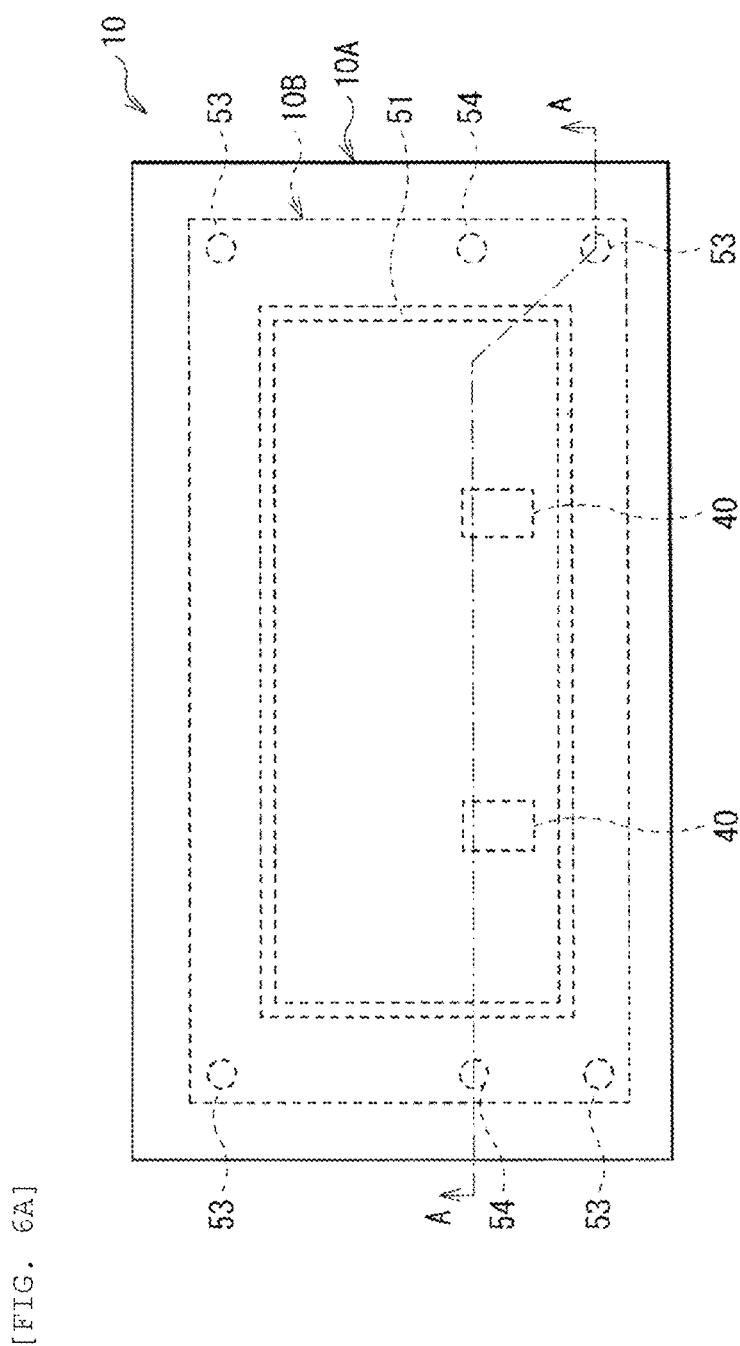
[FIG. 6A]

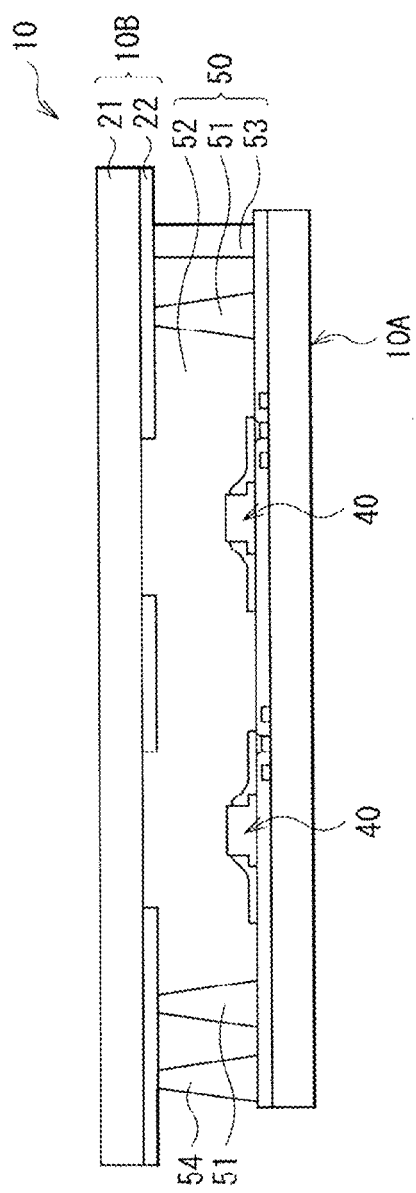
[FIG. 6B]

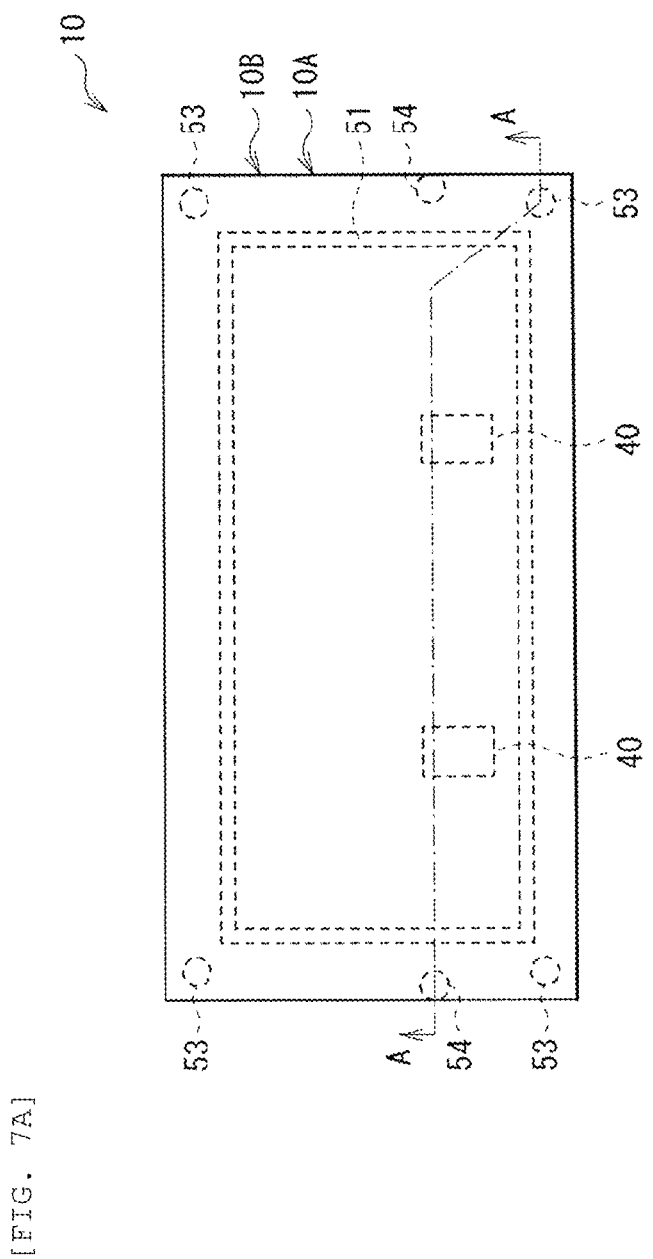

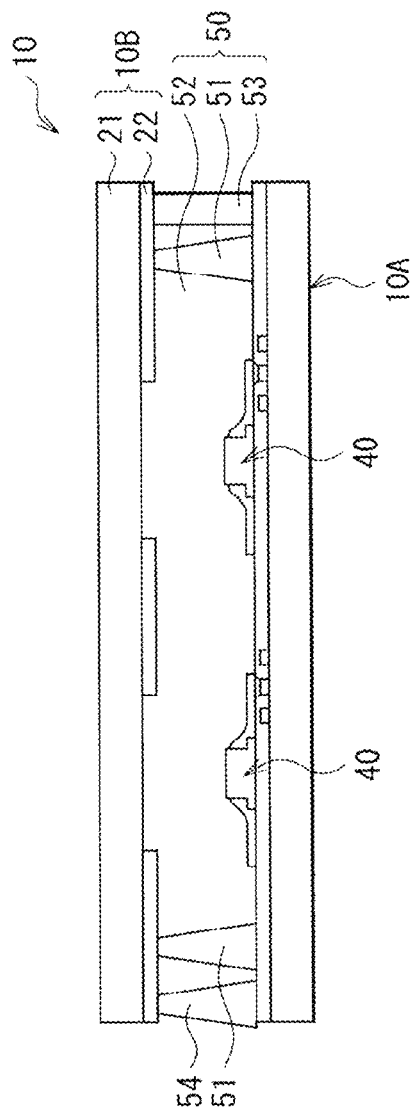
[FIG. 7B]

[FIG. 8]
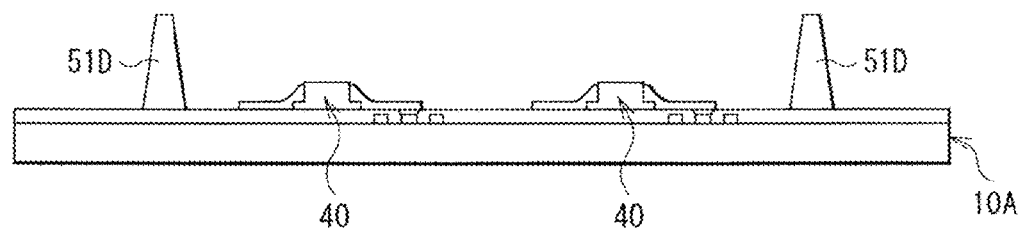
[FIG. 9]
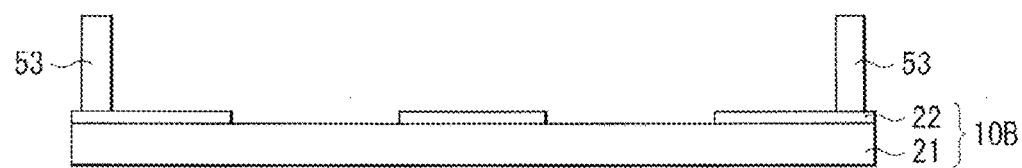
[FIG. 10A]
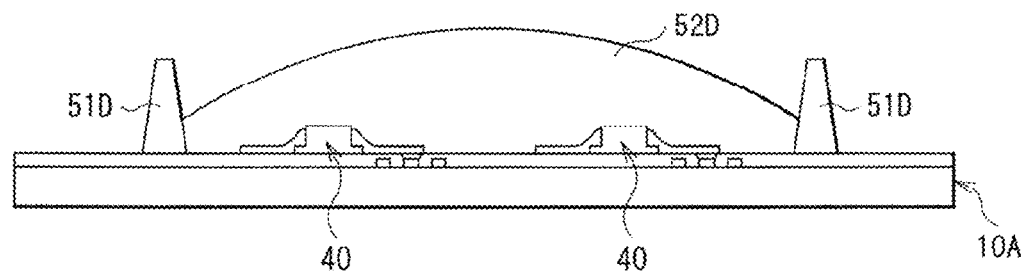
[FIG. 10B]
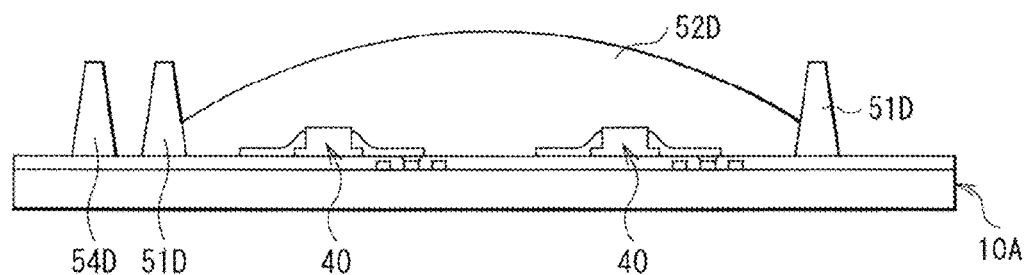

[ FIG. 11A ]
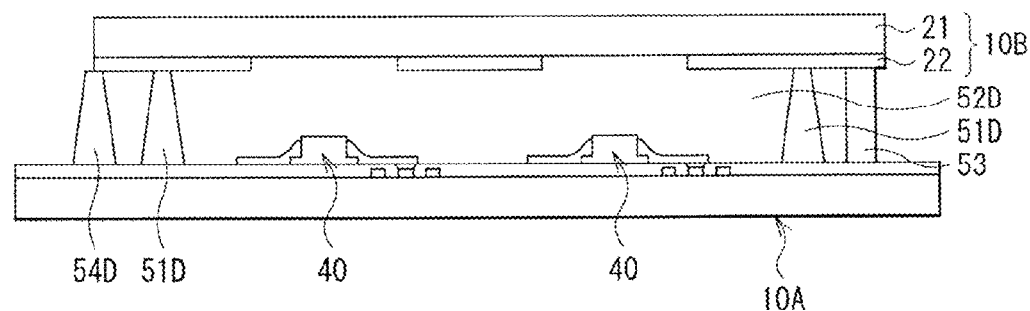
[ FIG. 11B ]
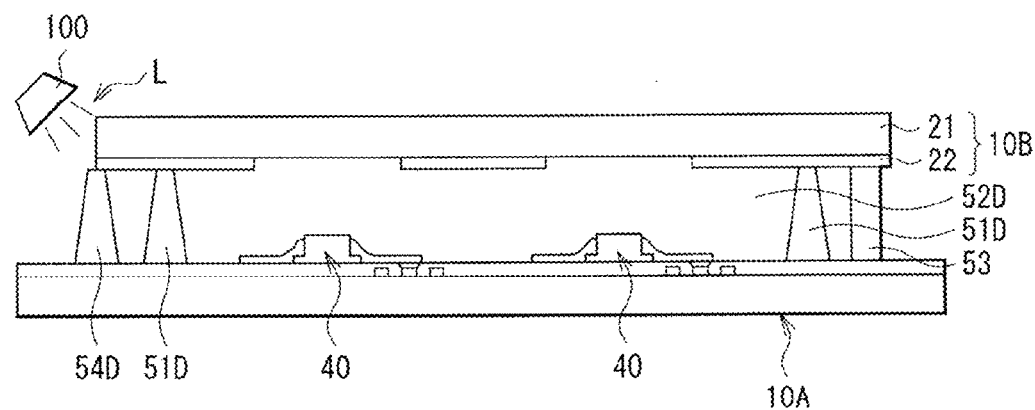
[ FIG. 12 ]
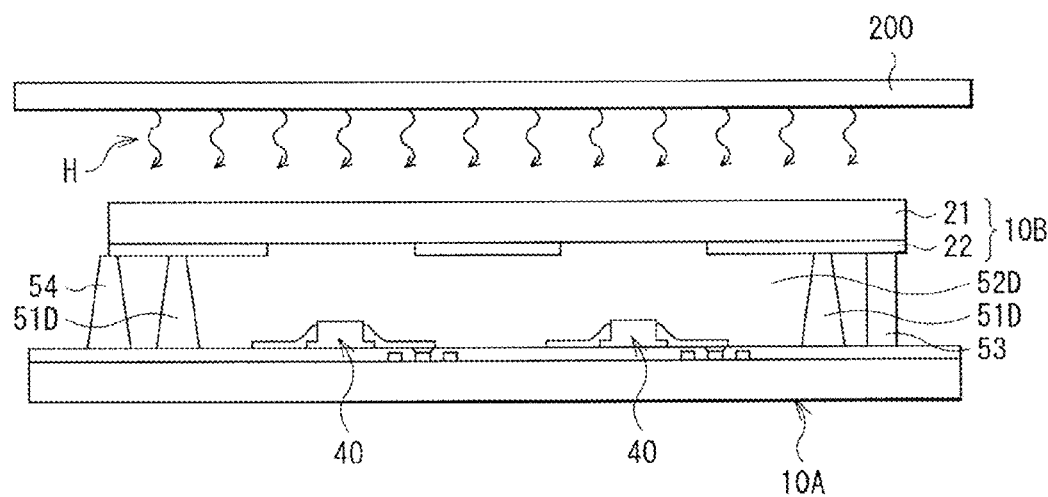

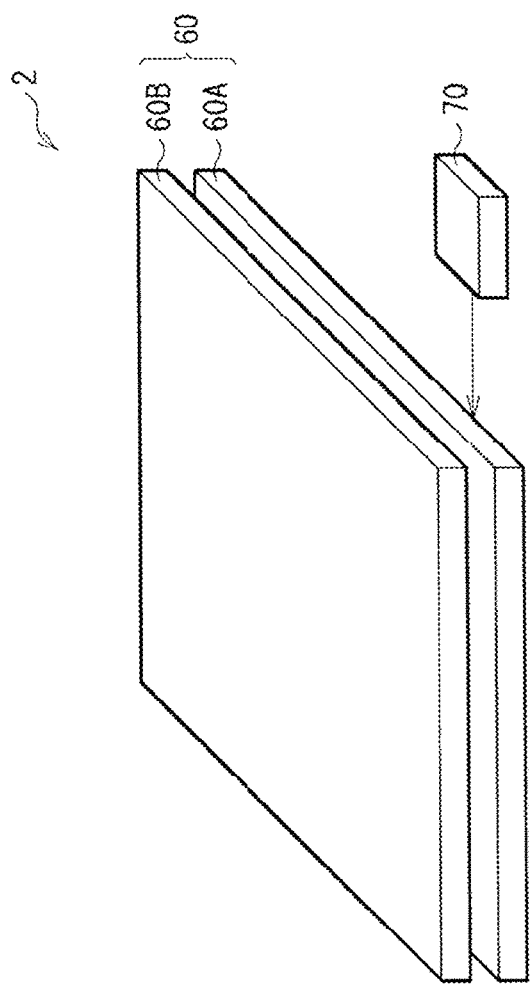
[FIG. 13]

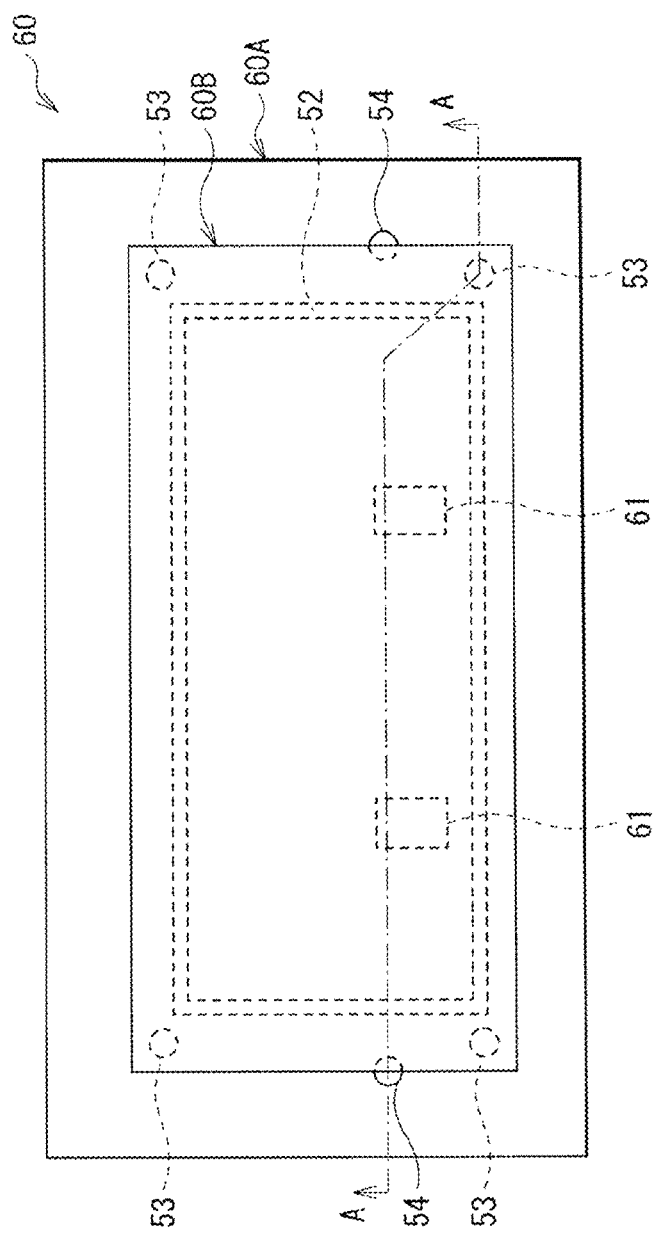
[FIG. 14A]

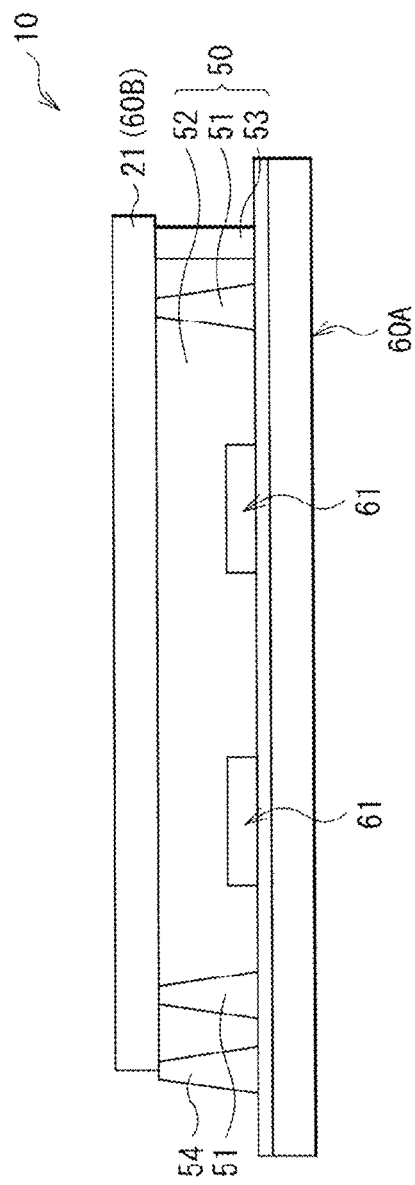
[FIG. 14B]

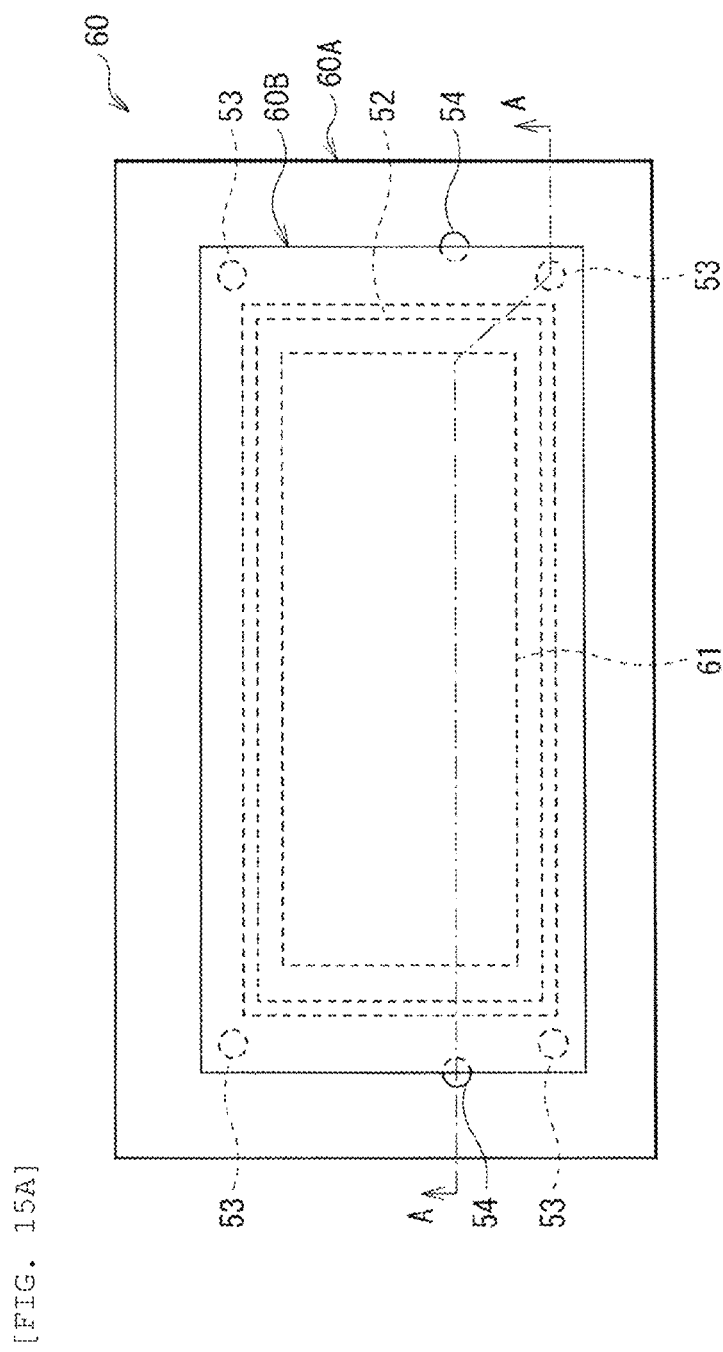
[FIG. 15A]

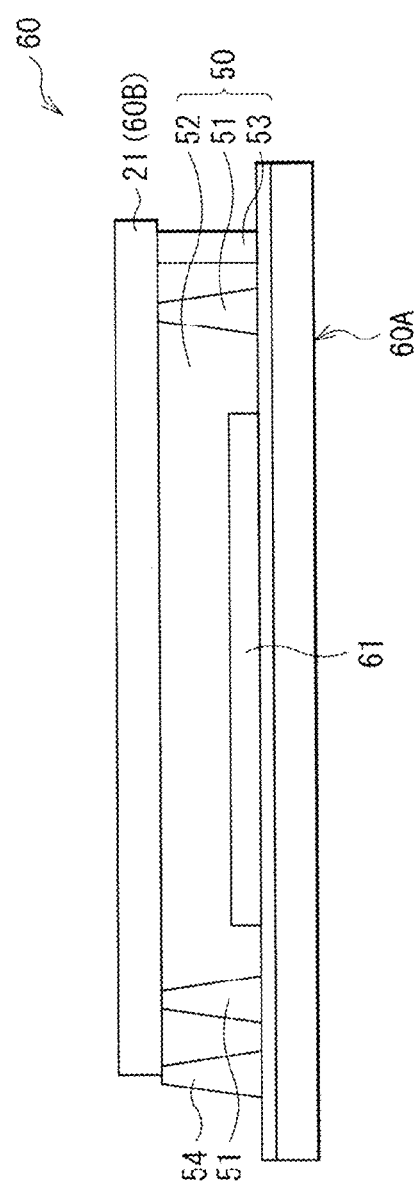
[FIG. 15B]

METHOD FOR MANUFACTURING AN OPTICAL UNIT AND ELECTRONIC APPARATUS

CROSS-REFERENCE TO RELATED APPLICATIONS

This application is a division of and claims the benefit under 35 U.S.C. §120 of U.S. patent application Ser. No. 14/438,910, titled "OPTICAL UNIT AND ELECTRONIC APPARATUS," filed on Apr. 28, 2015, which is a National Stage of International Application No. PCT/JP2013/078962, filed in the Japanese Patent Office as a Receiving Office on Oct. 25, 2013, which claims priority to Japanese Patent Application Number JP 2012-243318, filed in the Japanese Patent Office on Nov. 5, 2012, each of which is hereby incorporated by reference in its entirety.

TECHNICAL FIELD

The present technology relates to an optical unit that includes a mounting substrate in which one or a plurality of optical devices are arranged, to a method of manufacturing the optical unit, and to an electronic apparatus that includes the above-described optical unit.

BACKGROUND ART

In recent years, as a lightweight and thin display, an LED display that uses LEDs (Light Emitting Diodes) for display pixels has been attracted attention. The LED display is characterized by small dependency on angle of view that causes variation in contrast or color depending on an angle to be viewed and is also characterized by high reaction speed in a case of changing colors (see Patent Literature 1).

In order to improve moisture-resistance reliability of LED, LEDs are sealed by a resin, a glass substrate, or the like in some LED displays. For sealing the LEDs, for example, an ODF (one drop fill) method may be used which is common in liquid crystal injection (see Patent Literature 2). The ODF method may be used also when sealing an organic EL device in an organic EL (Electro Luminescence) display (see Patent Literature 3). In the ODF method, before attaching two substrates for sealing, a resin material is dropped onto one of the substrates.

PRIOR ART LITERATURE

Patent Literature

Patent Literature 1: Japanese Unexamined Patent Application Publication No. 2009-272591
Patent Literature 2: Japanese Unexamined Patent Application Publication No. 2006-268020
Patent Literature 3: Japanese Unexamined Patent Application Publication No. 2010-287421

SUMMARY

By the way, in a case where a UV curable resin is used as a sealing material, it is necessary to provide a path for allowing UV light to reach the sealing material. However, it is not easy to provide such a path in a device. Further, when sealing an LED, an organic EL device, or the like, it is necessary for the sealing material to be a resin that is superior in all of sealing characteristics, transparency, heat resistance, and light resistance. However, it is not easy to obtain such a resin as a UV curable resin. Accordingly, it may be an option to select a thermosetting resin instead of the UV curable resin as the sealing material. However, sealing with the use of the thermosetting resin has difficulty in process such as thermal expansion.

These issues are not limited to the LED display, the organic EL display, etc., and may arise in all of devices provided with an optical device that is necessary to be sealed.

Accordingly, it is desirable to provide an optical unit that is capable of effective sealing even without a special material, a special structure, etc., a method of manufacturing such an optical unit, and an electronic apparatus that includes such an optical unit.

An optical unit of an embodiment of the present technology includes: a mounting substrate including one or a plurality of optical devices that are mounted on a wiring substrate; and a counter substrate arranged on a one-or-plurality-of optical device side in a relationship with the mounting substrate, and arranged to be opposed to the mounting substrate. The optical unit further includes a sealing section arranged between the mounting substrate and the counter substrate, and configured to seal the one or plurality of optical devices. The sealing section includes: a circular seal section surrounding the one or plurality of optical devices on the wiring substrate from an in-plane direction of the wiring substrate; and an inside filling section with which inside of the seal section is filled and that seals the one or plurality of optical devices on the wiring substrate. The seal section and the inside filling section are each configured of a cured thermosetting resin. The inside filling section has light transmittance that is higher than light transmittance of the seal section. The inside filling section has a modulus of elasticity that is smaller than a modulus of elasticity of the seal section.

An electronic apparatus of an embodiment of the present technology includes the above-described optical unit, and a drive unit that drives the above-described optical unit.

In the optical unit and the electronic apparatus of the embodiments of the present technology, the sealing section that includes the seal section and the inside filling section is provided between the mounting substrate and the counter substrate. The inside filling section has higher light transmittance and a smaller modulus of elasticity, compared with the seal section. Accordingly, the sealing section may be formed by the following method, for example. Specifically, first, a thermosetting first resin is arranged so as to surround one or a plurality of optical devices on a wiring substrate from an in-plane direction of the wiring substrate. Subsequently, inside of the first resin is filled with a thermosetting second resin in a state in which the first resin is incompletely cured. The second resin has a modulus of elasticity that is smaller than a modulus of elasticity of the first resin and has light transmittance that is higher than light transmittance of the first resin. Subsequently, the first resin and the second resin are cured together by a heat process. At this time, because the modulus of elasticity of the second resin is smaller than the modulus of elasticity of the first resin, it is possible to prevent the first resin from being peeled off from the wiring substrate or the counter substrate when the second resin expands or contracts in a process of heating. Also, because the light transmittance of the second resin is higher than the light transmittance of the first resin, it is possible to cause the light emitted from the optical device to exit to the outside via the second resin, or to cause outside light to enter the optical device via the second resin.

A method of manufacturing an optical unit of an embodiment of the present technology includes the following three procedures (A) to (C).

(A) Preparing a mounting substrate and a counter substrate, the mounting substrate including one or a plurality of optical devices that are mounted on a wiring substrate, and the counter substrate being arranged on a one-or-plurality-of optical device side in a relationship with the mounting substrate (B) Arranging a thermosetting first resin to surround the one or plurality of optical devices on the wiring substrate from an in-plane direction of the wiring substrate, and subsequently filling inside of the first resin with a thermosetting second resin in a state in which the first resin is incompletely cured, the second resin having a modulus of elasticity that is smaller than a modulus of elasticity of the first resin and having light transmittance that is higher than light transmittance of the first resin (C) Curing the first resin and the second resin together by a heat process In the method of manufacturing the optical unit of an embodiment of the present technology, because the modulus of elasticity of the second resin is smaller than the modulus of elasticity of the first resin, it is possible to prevent the first resin from being peeled off from the wiring substrate or the counter substrate when the second resin expands or contracts in a process of heating. Also, because the light transmittance of the second resin is higher than the light transmittance of the first resin, it is possible to cause the light emitted from the optical device to exit to the outside via the second resin, or to cause outside light to enter the optical device via the second resin.

According to the optical unit, the method of manufacturing the optical unit, and the electronic apparatus of the embodiments of the present technology, the one or plurality of optical devices are sealed with the use of the two kinds of thermosetting resins that are different from each other in modulus of elasticity and light transmittance. Accordingly, it is possible to achieve effective sealing even without a special material, a special structure, etc.

BRIEF DESCRIPTION OF THE DRAWINGS

FIG. 1 is a perspective view illustrating an example of an outline configuration of a display apparatus according to a first embodiment of the present technology.

FIG. 2 is a plan view illustrating an example of a layout of a surface of a mounting substrate in FIG. 1.

FIG. 3 is a cross-sectional view illustrating an example of a cross-sectional configuration of a display panel in FIG. 1.

FIG. 4 is a plan view illustrating another example of the layout of the surface of the mounting substrate in FIG. 1.

FIG. 5A is a top view illustrating an example of a configuration of the display panel in FIG. 1.

FIG. 5B is a cross-sectional view illustrating an example of the configuration of the display panel in FIG. 1.

FIG. 6A is a top view illustrating another example of the configuration of the display panel in FIG. 1.

FIG. 6B is a cross-sectional view illustrating another example of the configuration of the display panel in FIG. 1.

FIG. 7A is a top view illustrating other example of the configuration of the display panel in FIG. 1.

FIG. 7B is a cross-sectional view illustrating other example of the configuration of the display panel in FIG. 1.

FIG. 8 is a cross-sectional view of the mounting substrate in a process of manufacturing the display panel in FIG. 1.

FIG. 9 is a cross-sectional view of a counter substrate in the process of manufacturing the display panel in FIG. 1.

FIG. 10A is a cross-sectional view illustrating a state of providing a first resin and a second resin on the mounting substrate in FIG. 8.

FIG. 10B is a cross-sectional view illustrating a state of providing a third resin on the mounting substrate in FIG. 10A.

FIG. 11A is a cross-sectional view illustrating a state of tentatively fixing the counter substrate in FIG. 9 onto the mounting substrate in FIG. 10B.

FIG. 11B is a cross-sectional view illustrating a state of tentatively fixing the counter substrate in FIG. 9 onto the mounting substrate in FIG. 10B.

FIG. 12 is a cross-sectional view illustrating a state of curing the first resin and the second resin in FIG. 11B.

FIG. 13 is a perspective view illustrating an example of a light receiving unit according to a second embodiment of the present technology.

FIG. 14A is a top view illustrating an example of a configuration of a light receiving panel in FIG. 13.

FIG. 14B is a cross-sectional view illustrating an example of the configuration of the light receiving panel in FIG. 13.

FIG. 15A is a top view illustrating another example of the configuration of the light receiving panel in FIG. 13.

FIG. 15B is a cross-sectional view illustrating another example of the configuration of the light receiving panel in FIG. 13.

EMBODIMENTS

Some embodiments of the invention are described below in detail with reference to the drawings. Incidentally, the description is provided in the following order.

1. First Embodiment (Display apparatus)
2. Modification of First Embodiment (Display apparatus)
3. Second Embodiment (Light Receiving Unit)
4. Modification of Second Embodiment (Light Receiving Unit, Imaging Unit, and Power Generating Unit)

[1. First Embodiment]
[Configuration]

FIG. 1 illustrates, in a perspective manner, an example of an outline configuration of a display apparatus 1 according to an embodiment of the present technology. The display apparatus 1 of the present embodiment may be a so-called LED display, and an LED is used therein as a display pixel. As illustrated in FIG. 1, the display apparatus 1 may include a display panel 10 and a drive circuit 20 that drives the display panel 10 (specifically, a light emitting section 40 described later), for example.

(Display Panel 10)

The display panel 10 is configured of a mounting substrate 10A and a counter substrate 10B that are caused to overlap each other. A surface of the counter substrate 10B is configured to be an image display surface, and has a display region in a middle portion thereof and a frame region that is a non-display region around the display region.

(Mounting Substrate 10A)

FIG. 2 illustrates an example of a layout of a region that is of a surface, of the mounting substrate 10A, on the counter substrate 10B side, and corresponds to the display region. As illustrated in FIG. 2, the mounting substrate 10A may include a plurality of Y-lines 14 and a plurality of X-lines 15 in the region that is of the surface of the mounting substrate 10A and corresponds to the display region, for example. The X-lines 15 correspond to scanning lines. The Y-lines 14 and the X-lines 15 may be formed inside the mounting substrate 10A, and may not be formed on a mounting surface on which the light emitting sections 40 (described later) corresponding to display pixels are mounted, for example.

The Y-lines 14 are each a data line to which a signal in accordance with an image signal is inputted by the drive circuit 20. The signal in accordance with the image signal may be, for example, a signal that controls an ON period (light emission period) of the light emitting section 40, and may be a signal having a small current. The Y-lines 14 are formed to extend in a predetermined direction (a column direction, in the drawing), and are arranged side by side at a predetermined pitch.

The X-lines 15 are each a scanning line to which a signal that selects the light emitting section 40 is inputted by the drive circuit 20. The signal that selects the light emitting section 40 may be, for example, a signal that supplies a drive current to the light emitting section 40, and may be a signal having a large current. The X-lines 15 are formed to extend in a direction (a row direction, in the drawing) intersecting (for example, orthogonal to) the Y-lines 14, and are arranged side by side at a predetermined pitch. The Y-lines 14 and the X-lines 15 may be each made of a conductive material such as Cu (copper), for example. The X-lines 15 are arranged in a layer that is deeper than the Y-lines 14, specifically, in a layer between a later-described support substrate 11 and a layer including the Y-lines 14 (that is, specifically, in a layer same as an inter-layer insulating film 12 described later).

The mounting substrate 10A includes a plurality of light emitting sections 40 that correspond to display pixels. The light emitting sections 40 may be arranged side by side in a direction parallel to the Y-lines 14 and in a direction parallel to the X-lines 15, for example. In other words, the light emitting sections 40 may be arranged in a matrix in the display region. Each of the light emitting sections 40 is electrically connected to the Y-line 14 via a conductive connection section 19A, and is electrically connected to the X-line 15 via a conductive connection section 19B.

As illustrated in FIGS. 2 and 3, the mounting substrate 10A may be configured of the plurality of light emitting sections 40 that are mounted on a wiring substrate 30, for example. The wiring substrate 30 may be configured by laminating the inter-layer insulating film 12 and an inter-layer insulating film 13 in order on the support substrate 11, for example. The support substrate 11 may be configured of a glass substrate, a resin substrate, a silicon substrate, or the like, for example. The support substrate 11 may include a via for achieving electric connection with the light emitting sections 40, on an as-necessary basis. The support substrate 11 may further include, on a rear surface thereof, an electrode pad that is electrically connected to the light emitting sections 40 via the via. It is to be noted that, in a case where a top surface of the wiring substrate 30 has a portion that is not opposed to the counter substrate 10B, an electrode pad that is electrically connected to lines routed from the light emitting sections 40 may be provided on the top surface of the wiring substrate 30.

The inter-layer insulating film 12 and the inter-layer insulating film 13 may each be made of SiN, $SiO_2$, or $Al_2O_3$, for example. Here, the inter-layer insulating film 13 is a layer that configures an uppermost surface of the support substrate 11, and the Y-lines 14 may be formed in the same layer as the inter-layer insulating film 13 that is an uppermost layer, for example. In this case, the Y-line 14 is electrically connected to the connection section 19A via a conductive connection section 16 that is formed in the same layer as the inter-layer insulating film 13. On the other hand, the X-line 15 may be formed in a layer between the support substrate 11 and the inter-layer insulating film 13, for example, and may be formed in the same layer as the inter-layer insulating film 12, for example. In this case, the X-line 15 is electrically connected to the connection section 19B via conductive connection sections 17 and 18 that are formed in the same layers as the inter-layer insulating films 12 and 13, respectively.

(Counter Substrate 10B)

The counter substrate 10B are arranged on the light emitting section 40 side in a relationship with the mounting substrate 10A, and is arranged to be opposed to the mounting substrate 10A. As illustrated in FIG. 3, the counter substrate 10B may include a protection substrate 21, and a black matrix 22 that is formed on the mounting substrate 10A side of the protection substrate 21, for example. The protection substrate 21 is a light transmissive substrate that transmits light emitted from each of the light emitting sections 40, and may be configured of a glass substrate, a transparent resin substrate, or the like, for example. The black matrix 22 may be provided on a surface, of the protection substrate 21, on the mounting substrate 10A side, for example. The black matrix 22 may be provided in an opposing region that is opposed to a gap between adjacent display pixels when viewed from a direction of a normal to the wiring substrate 30 (or the mounting substrate 10A). The black matrix 22 is configured to absorb the light emitted from each of the light emitting devices 40, and may be configured of a solidified coating material in which carbon is dispersed in silicone, for example.

Next, an inside configuration of the light emitting section 40 is described. The light emitting section 40 is configured of a plurality of LED chips that are mounted on a device substrate. The LED chips may each include a semiconductor layer that includes a laminated structure in which semiconductor layers having conductivity types different from each other sandwich an active layer in between. Also, the LED chips may each include two electrodes arranged on a common surface (same surface) of the semiconductor layer. One of the electrodes is electrically connected to the semiconductor layer having one of the conductivity types in the semiconductor layer, and the other of the electrodes is electrically connected to the semiconductor layer having the other of the conductivity types in the semiconductor layer.

The device substrate may be configured by laminating an insulating layer and an electrode pad in order on a support substrate, for example. The support substrate may be configured of a silicon substrate, a resin substrate, or the like, for example. The insulating layer is configured to form a flat surface that is a formation surface of the electrode pad. The electrode pad may serve as a feeding layer in electrolyte plating, for example. Also, the electrode pad may further serve as an electrode pad on which the LED chips are mounted. The LED chips are mounted on an electrode pad. Specifically, one of the electrodes in the LED chip is connected to one of the electrode pads via plating metal (not illustrated), and the other of the electrodes in the LED chip is connected to the other of the electrode pads via plating metal (not illustrated).

In a case where the light emitting section 40 includes three LED chips, one of the LED chips may be, for example, an LED chip that emits red light, another of the LED chips may be, for example, an LED chip that emits green light, and the remaining one of the LED chips may be, for example, an LED chip that emits blue light. It is to be noted that the light emitting section 40 may have a configuration in which a plurality of light emitting elements 40A each configured of an element substrate and one LED chip mounted thereon are regarded as one group. To give an example, as illustrated in FIG. 4, the light emitting section 40 may have a configuration in which three light emitting elements 40A are regarded as one group. In this case, in the three light emitting elements 40A in one group, one of the light emitting elements 40A may include an LED chip that emits red light, another one of the light emitting elements 40A may include an LED chip that emits green light, and the remaining one of the light emitting elements 40A may include an LED chip that emits blue light, for example.

(Sealing Section 50)

FIG. 5A illustrates an example of a top surface configuration of the display panel 10. FIG. 5B illustrates an example of a cross-sectional configuration in a direction of arrows A-A in FIG. 5A. As illustrated in FIGS. 3, 5A, and 5B, the display panel 10 may include a sealing section 50 between the mounting substrate 10A and the counter substrate 10B, for example. The sealing section 50 seals the respective light emitting sections 40 on the wiring substrate 30. The sealing substrate 50 includes a circular seal section 51 and an inside filling section 52. The seal section 51 surrounds all of the light emitting sections 40 on the wiring substrate 30 from an in-plane direction of the wiring substrate 30. Inside of the seal section 51 is filled with the inside filling section 52, and the inside filling section 52 seals all of the light emitting sections 40 on the wiring substrate 30. The seal section 51 may be arranged in the frame region of the display panel 10, for example. On the other hand, the inside filling section 52 may be arranged at least in the entire display region of the display panel 10, for example.

The seal section 51 is configured to prevent moisture or the like from entering deep inside the sealing section 50 (the inside filling section 52), and is configured of a thermosetting resin having a large modulus of elasticity. The modulus of elasticity of the seal section 51 may be about 2 GPa, for example. The seal section 51 is formed by curing the thermosetting resin (first resin) having a large modulus of elasticity. As such a material, a mixed resin in which a filler is added to an epoxy-based resin may be preferable. Viscosity of the mixed resin may be about 350 Pa·S, for example.

The inside filling section 52 is configured to prevent the light emitting sections 40 from being exposed to moisture or the like, and is configured of a thermosetting resin that has superior light resistance, superior light transmission characteristics, etc. The light transmittance of the inside filling section 52 is higher than light transmittance of the seal section 51. Accordingly, the light emitted from the light emitting section 40 is allowed to pass through the inside filling section 52. A modulus of elasticity of the inside filling section 52 is different from the modulus of elasticity of the seal section 51. Specifically, the modulus of elasticity of the inside filling section 52 is smaller than the modulus of elasticity of the seal section 51. The inside filling section 52 is formed by curing the thermosetting resin (second resin) that has superior light resistance, superior light transmission characteristics, etc. As such a material, a silicone resin may be preferable. The silicone resin is not only superior in light resistance, light transmission characteristics, etc., but is also a material having viscosity that is extremely easy to be adjusted. Accordingly, it is extremely easy to finely adjusting the modulus of elasticity (or the viscosity) thereof so that a modulus of elasticity of the cured resin (inside filling section 52) is in a desired range, as described later. It is to be noted that it is also possible to employ an olefin-based resin, an acrylic-based resin, or the like instead of the silicone resin, depending on the magnitude of the modulus of elasticity of the inside filling section 52.

The modulus of elasticity of the inside filling section 52 is smaller than the modulus of elasticity of the seal section 51. The modulus of elasticity of the inside filling section 52 may be in a range from $\frac{1}{500}$ to $\frac{1}{100000}$, compared with the modulus of elasticity of the seal section 51. In the case where the modulus of elasticity of the seal section 51 is about 2 GPa, the modulus of elasticity of the inside filling section 52 may be about 1.5 MPa, for example. Moduli of elasticity of the first resin and the second resin may be preferably adjusted so that the moduli of elasticity of the first resin and the second resin have the above-described relationship. In such a case, it is possible to prevent the first resin from being peeled off from the wiring substrate 30 or the counter substrate 10B when the second resin expands or contracts in a process of heating (curing). As a difference in modulus of elasticity between the first resin and the second resin is made larger, it is easier for a crack to be caused in the second resin when the second resin is cured and contracts. On the other hand, as the difference in modulus of elasticity between the first resin and the second resin is made smaller, the second resin functions to push out the first resin as a result of expansion of the second resin in the middle of curing. Accordingly, a bank formed of the first resin breaks, which makes it easier for the second resin to leak outside.

A curing starting temperature of the first resin may be lower than a curing starting temperature of the second resin. In a case where the curing starting temperatures of the first resin and the second resin are in the above-described relationship, when heat is applied to the first resin and the second resin at the same time, the first resin starts to be cured prior to the second resin, and the first resin serves as a bank for preventing the second resin from flowing outside. Also, due to the curing of the first resin prior to curing of the second resin, the seal section 51 defines a thickness of the sealing section 50, and accordingly, a size of a gap between the top surface of the light emitting section 40 and a bottom surface of the counter substrate 10B. As a result, it is possible to define the size of the gap with the use of the seal section 51 even when no spacer is provided in the sealing section 50.

The sealing section 50 may further include a post 53 and a tentative fixing section 54 in a portion that is between the mounting substrate 10A and the counter substrate 10B and is on a periphery of the seal section 51, on an as-necessary basis.

The post 53 is configured to prevent variation in a plane of a size of a portion that is the gap between the mounting substrate 10A and the counter substrate 10B and corresponds to the display region of the display panel 10 due to bending of the mounting substrate 10A and the counter substrate 10B. The post 53 may be arranged in the frame region of the display panel 10, for example. As illustrated in FIGS. 5A and 5B, the posts 53 may be arranged on four corners of the counter substrate 10B in a one-to-one relationship, for example. The post 53 may be formed by curing a photosensitive acrylic resin or the like, for example. The post 53 may be formed by applying a photosensitive acrylic resin or the like onto the entire surface of the counter substrate 10B by a spin coating method, and subsequently performing exposure and development on the applied resin, for example.

The tentative fixing section 54 prevents a positional relationship of the mounting substrate 10A and the counter substrate 10B from being out of a desired range in a process of attaching the mounting substrate 10A and the counter substrate 10B to each other. One end of the tentative fixing section 54 is fixed to the mounting substrate 10A, and the other end thereof is fixed to the counter substrate 10B. The tentative fixing section 54 may be arranged in the frame region of the display panel 10, for example. As illustrated in FIGS. 5A and 5B, the tentative fixing sections 54 may be arranged on two sides out of four sides of the counter substrate 10B in a one-to-one relationship, for example. The tentative fixing section 54 may be configured of a cured UV curable resin, for example.

It is to be noted that FIGS. 5A and 5B illustrate, as an example, the case where the mounting substrate 10A is larger than the counter substrate 10B. However, as illustrated in FIGS. 6A and 6B, the mounting substrate 10A may be smaller than the counter substrate 10B, for example. Alternatively, as illustrated in FIGS. 7A and 7B, the mounting substrate 10A and the counter substrate 10B may have the same size, for example. In the case where the mounting substrate 10A is larger than the counter substrate 10B, the top surface of the mounting substrate 10A has a portion that is not opposed to the counter substrate 10B. In this case, the non-opposing portion may be provided with an electrode pad that is electrically connected to the light emitting sections 40. Alternatively, in the case where the mounting substrate 10A is smaller than the counter substrate 10B or has the same size as the counter substrate 10B, an electrode pad that is electrically connected to the light emitting section 40 may be provided on the rear surface of the support substrate 11 via a through via provided in the support substrate 11.

(Drive Circuit 20)

The drive circuit 20 may be configured of a data driver that drives the Y-lines 14, and a scanning driver that drives the X-lines 15, for example. The drive circuit 20 may be configured of an IC chip, for example. The drive circuit 20 may be mounted on the mounting substrate 10A, or may be mounted on a print wiring substrate provided separately from the display panel 10, for example.

[Manufacturing Method]

Next, referring to FIGS. 8 to 12, an example of a method of manufacturing the display panel 10 is described.

First, the mounting substrate 10A in which the plurality of light emitting sections 40 are mounted on the wiring substrate 30 is prepared. Next, as illustrated in FIG. 8, a first resin 51D that is a raw material (material before curing) of the seal section 51 may be provided in a circular shape in a region that is on the top surface of the mounting substrate 10A and corresponds to the frame region of the display panel 10, for example. In other words, the first resin 51D is so arranged as to surround all of the light emitting sections 40 on the wiring substrate 30 from the in-plane direction of the wiring substrate 30.

The first resin 51D is a thermosetting resin. A modulus of elasticity of the first resin 51D is larger than a modulus of elasticity of a second resin 52D that is a raw material (material before curing) of the inside filling section 52. The first resin 51D is a mixed resin in which a filler is added to an epoxy resin, and has viscosity of about 350 Pa·S. In a case where the viscosity is as high as about 350 Pa·S, a screw dispenser may be preferably used. The cross-sectional area of the first resin 51D may be about 40000 µm², for example. A curing starting temperature of the first resin 51D is lower than a curing starting temperature of the second resin 52D. The curing starting temperature of the first resin 51D may be 120° C., for example.

Next, the counter substrate 10B that is arranged on the light emitting section 40 side in the relationship with the mounting substrate 10A is prepared. Subsequently, as illustrated in FIG. 9, for example, a plurality of columnar posts 53 may be provided in a region that is on the top surface (the surface to be opposed to the mounting substrate 10A later) of the counter substrate 10B and corresponds to the frame region of the display panel 10, for example.

Next, a portion that is on the top surface of the mounting substrate 10A applied with the first resin 51D and is inside the seal section 51 is filled with the second resin 52D that is the raw material of the inside filling section 52, in a state in which the first resin 51D is incompletely cured (FIG. 10A). In this case, the second resin 52D may cause all of the light emitting sections 40 on the mounting substrate 10A to be embedded, for example.

The second resin 52D is a thermosetting resin. Light transmittance of the second resin 52D is higher than light transmittance of the first resin 51D. The modulus of elasticity of the second resin 52D is smaller than the modulus of elasticity of the first resin 51D. The second resin 52D is a silicone resin, and has viscosity of about 500 mPa·S. In a case where the viscosity is as low as about 500 mPa·S, a liquid crystal dropping apparatus may be used. It is to be noted that coating by screen printing may be performed instead of dropping with the use of the liquid crystal dropping apparatus, or alternatively, coating may be performed with the use of a jet dispenser. The curing starting temperature of the second resin 52D is higher than the curing starting temperature of the first resin 51D. In a case where the curing starting temperature of the first resin 51D is 120° C., the curing starting temperature of the second resin 52D may be 150° C., for example.

Next, a third resin 54D that is a raw material of the tentative fixing section 54 is provided in a region that is on the top surface of the mounting substrate 10A and corresponds to the frame region of the display panel 10 (FIG. 10B). The third resin 54D is a UV curable resin.

Next, alignment of the mounting substrate 10A and the counter substrate 10B is performed, and the mounting substrate 10A and the counter substrate 10B are attached to each other in vacuum (FIG. 11A). Subsequently, ultraviolet rays L are emitted from a ultraviolet ray application apparatus 100 and applies the ultraviolet rays L to the third resin 54D (FIG. 11B). Thus, position at which the mounting substrate 10A and the counter substrate 10B are attached is made not to be shifted. Thereafter, the mounting substrate 10A and the counter substrate 10B are released in atmosphere in a state being attached to each other. This makes it possible to attach the mounting substrate 10A and the counter substrate 10B to each other while preventing air bubbles from being contained in the first resin 51D and the second resin 52D.

Next, the mounting substrate 10A and the counter substrate 10B in a state of being attached to each other are heated by heat H applied from a heating apparatus 200. Thus, the first resin 51D and the second resin 52D are cured together by a heat process. As a result, the first resin 51D becomes the seal section 51, and the second resin 52D becomes the inside filling section 52.

In this case, the curing starting temperature of the first resin 51D may be 120° C., for example, and the curing starting temperature of the second resin 52D may be 150° C., for example. When a heat process is performed at 150° C. for one hour on the first resin 51D and the second resin 52D with the use of the heating apparatus 200, the first resin 51D first starts to be cured, and the second resin 52D starts to be cured subsequently. Accordingly, the first resin 51D serves as a bank that prevents the second resin 52D from flowing outside.

Moreover, moduli of elasticity of the first resin 51D and the second resin 52D may be preferably adjusted so that the modulus of elasticity of the inside filling section 52 to be in a range from $1/500$ to $1/100000$, compared with the modulus of elasticity of the seal section 51. In such a case, when the second resin 52D expands or contracts in a process of heating, it is possible to prevent the first resin 51D from being peeled off from the wiring substrate 30 or the counter substrate 10B. At this time, it is also possible to prevent a crack from being caused in the second resin 52D.

[Operation and Effects of Display Apparatus 1]

In the present embodiment, the light emitting sections 40 may be driven by the drive circuit 20 via the Y-lines 14 and the X-lines 15 that are arranged in a simple matrix (may be driven in a simple matrix manner). Accordingly, currents are sequentially supplied to the light emitting sections 40 that are provided near intersections of the Y-lines 14 and the X-lines 15, and an image is thereby displayed in the display region.

By the way, in the present embodiment, the sealing section 50 that includes the seal section 51 and the inside filling section 52 is provided between the mounting substrate 10A and the counter substrate 10B. The inside filling section 52 has higher light transmittance and a smaller modulus of elasticity, compared with the seal section 51. Further, the curing starting temperature of the raw material (second resin 52D) of the inside filling section 52 is higher than the curing starting temperature of the raw material (first resin 51D) of the seal section 51. Accordingly, it may be possible to form the sealing section 50 by the method as described above, for example. As a result, it is possible to seal the respective light emitting sections 40 even without a special material, a special structure, etc.

[2. Modification of First Example]

In the above-described embodiment, LEDs are mounted on the wiring substrate 30 as the plurality of light emitting sections 40. However, self light emitting devices such as organic EL devices may be mounted, for example. Moreover, in the above-described embodiment, the black matrix 22 is provided on the counter substrate 10B. However, the black matrix 22 may be omitted.

Moreover, in the above-described embodiment, the light emitting section 40 includes three LED chips. However, the light emitting section 40 may include less-than-three LED chips, or may include four-or-more LED chips. Moreover, in the above-described embodiment, the respective LED chips in the light emitting section 40 are connected to the Y-lines 14 different from one another. However, the respective LED chips in the light emitting section 40 may be connected to the same Y-line 14, for example, which is not illustrated.

Moreover, in the above-described embodiment, an example is described in which the respective light emitting sections 40 are driven in a passive manner by the drive circuit 20. However, the respective light emitting sections 40 may be driven in an active matrix manner by the drive circuit 20, for example.

Moreover, in the above-described embodiment, the third resin 54D is provided on the mounting substrate 10A. However, the third resin 54D may be provided on the counter substrate 10B.

[3. Second Embodiment]

[Configuration]

FIG. 13 illustrates an example of an outline configuration of a light receiving unit 2 according to a second embodiment of the present technology in a perspective manner. The light receiving unit 2 of the present embodiment may be configured of a plurality of light receiving devices 61 that are arranged two-dimensionally. The light receiving devices 61 are each a device that converts light into electricity, and may each be a PD (Photo Diode) or a photoelectric conversion device, for example. The PD is a device for sensing light, whereas the photoelectric conversion device is a device for obtaining energy from light. As illustrated in FIG. 13, the light receiving unit 2 may include a light receiving panel 60 and a drive circuit 70 that drives the light receiving panel 60 (specifically, the light receiving devices 61 described later), for example.

The light receiving panel 60 is configured of a mounting substrate 60A and a counter substrate 60B that are caused to overlap each other. A surface of the counter substrate 60B is configured to be a light receiving surface. As illustrated in FIGS. 14A and 14B, the mounting substrate 60A corresponds to the mounting substrate 10A in which the light receiving devices 61 are provided instead of the light emitting sections 40. The light receiving devices 61 each include a semiconductor layer having a photoelectric conversion function, and two electrodes that are electrically connected to the semiconductor layer. As illustrated in FIG. 14B, the counter substrate 60B may be configured of the protection substrate 21, for example. It is to be noted that the black matrix 22 may be provided on a surface, of the protection substrate 21, on the mounting substrate 60A side on an as-necessary basis.

[4. Modification of Second Embodiment]

It is to be noted that, as illustrated in FIGS. 15A and 15B, the mounting substrate 60A may include only one light receiving device 61, for example. In this case, the one light receiving device 61 may be an image sensor in which a number of light receiving elements are integrated, or may be an X-ray sensor in which a number of X-ray light receiving elements are integrated. Alternatively, the one light receiving device 61 may be a power generating device in which a number of photoelectric conversion elements are integrated.

Moreover, the present technology may employ the following configurations, for example.

(1)

An optical unit, including:

a mounting substrate including one or a plurality of optical devices that are mounted on a wiring substrate;

a counter substrate arranged on a one-or-plurality-of optical device side in a relationship with the mounting substrate, and arranged to be opposed to the mounting substrate; and a sealing section arranged between the mounting substrate and the counter substrate, and configured to seal the one or plurality of optical devices, the sealing section including a circular seal section surrounding the one or plurality of optical devices on the wiring substrate from an in-plane direction of the wiring substrate, and an inside filling section with which inside of the seal section is filled and that seals the one or plurality of optical devices on the wiring substrate, the seal section and the inside filling section each being configured of a cured thermosetting resin, and the inside filling section having light transmittance that is higher than light transmittance of the seal section, and having a modulus of elasticity that is smaller than a modulus of elasticity of the seal section.

(2)

The optical unit according to (1), wherein the modulus of elasticity of the inside filling section is in a range from $1/500$ to $1/100000$, compared with the modulus of elasticity of the seal section.

(3)

The optical unit according to (1) or (2), wherein a curing starting temperature of a material of the seal section before curing is lower than a curing starting temperature of a material of the inside filling section before curing.

(4)

The optical unit according to any one of (1) to (3), wherein the seal section is formed by curing a resin in which a filler is added to an epoxy-based resin, and the inside filling section is formed by curing a silicone resin.

(5)

The optical unit according to any one of (1) to (4), wherein the one or plurality of optical devices are one or a plurality of light emitting devices or one or a plurality of light receiving devices.

(6)

The optical unit according to any one of (1) to (5), wherein the counter substrate includes a black matrix in an opposing region that is opposed to a gap between adjacent display pixels when viewed from a direction of a normal to the mounting substrate.

(7)

An electronic apparatus, including:

an optical unit; and a drive unit configured to drive the optical unit, the optical unit including a mounting substrate including one or a plurality of optical devices that are mounted on a wiring substrate, a counter substrate arranged on a one-or-plurality-of optical device side in a relationship with the mounting substrate, and arranged to be opposed to the mounting substrate, and a sealing section arranged between the mounting substrate and the counter substrate, and configured to seal the one or plurality of optical devices, the sealing section including a circular seal section surrounding the one or plurality of optical devices on the wiring substrate from an in-plane direction of the wiring substrate, and an inside filling section with which inside of the seal section is filled and that seals the one or plurality of optical devices on the wiring substrate, the seal section and the inside filling section each being configured of a cured thermosetting resin, and the inside filling section having light transmittance that is higher than light transmittance of the seal section, and having a modulus of elasticity that is smaller than a modulus of elasticity of the seal section.

(8)

A method of manufacturing an optical unit, the method including:

preparing a mounting substrate and a counter substrate, the mounting substrate including one or a plurality of optical devices that are mounted on a wiring substrate, and the counter substrate being arranged on a one-or-plurality-of optical device side in a relationship with the mounting substrate;

arranging a thermosetting first resin to surround all of the one or plurality of optical devices on the wiring substrate from an in-plane direction of the wiring substrate, and subsequently filling inside of the first resin with a thermosetting second resin in a state in which the first resin is incompletely cured, the second resin having a modulus of elasticity that is smaller than a modulus of elasticity of the first resin and having light transmittance that is higher than light transmittance of the first resin; and curing the first resin and the second resin together by a heat process.

This application claims priority on the basis of Japanese Patent Application JP 2012-243318 filed Nov. 5, 2012, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing an optical unit, the method comprising:

preparing a mounting substrate and a counter substrate, the mounting substrate including one or a plurality of optical devices that are mounted on a wiring substrate, and the counter substrate being arranged on a one-or-plurality-of optical device side in a relationship with the mounting substrate;

arranging a thermosetting first resin to surround all of the one or plurality of optical devices on the wiring substrate from an in-plane direction of the wiring substrate, and subsequently filling inside of the first resin with a thermosetting second resin in a state in which the first resin is incompletely cured, the second resin having a modulus of elasticity that is smaller than a modulus of elasticity of the first resin and having light transmittance that is higher than light transmittance of the first resin, wherein the modulus of elasticity of the second resin is in a range from $1/500$ to $1/100000$, compared with the modulus of elasticity of the first resin; and curing the first resin and the second resin together by a heat process.

2. The method according to claim 1, wherein a curing starting temperature of the first resin before curing is lower than a curing starting temperature of the second resin before curing.

3. The method according to claim 1, wherein the first resin comprises an epoxy-based resin to which a filler is added, and the second resin comprises silicone.

4. The method according to claim 1, wherein the one or plurality of optical devices are one or a plurality of light emitting devices or one or a plurality of light receiving devices.

5. The method according to claim 1, wherein the counter substrate includes a black matrix in an opposing region that is opposed to a gap between adjacent display pixels when viewed from a direction of a normal to the mounting substrate.

6. The method according to claim 1, further comprising connecting the optical unit to a drive unit that is configured to drive the optical unit.

* * * * *